United States Patent [19]
Lee et al.

[11] Patent Number: 5,848,000
[45] Date of Patent: Dec. 8, 1998

[54] FLASH MEMORY ADDRESS DECODER WITH NOVEL LATCH STRUCTURE

[75] Inventors: Peter W. Lee, Saratoga, Calif.; Hsing-Ya Tsao; Fu-Chang Hsu, both of Taipei, Taiwan

[73] Assignee: Aplus Flash Technology, Inc., Santa Clara, Calif.

[21] Appl. No.: 819,323

[22] Filed: Mar. 18, 1997

Related U.S. Application Data

[63] Continuation-in-part of Ser. No. 624,322, Mar. 29, 1996, Pat. No. 5,646,890, Ser. No. 645,630, May 14, 1996, Pat. No. 5,687,121, Ser. No. 676,066, Jul. 5, 1996, Ser. No. 726,670, Oct. 7, 1996, Pat. No. 5,682,350, and Ser. No. 779,765, Jan. 7, 1997, abandoned.

[51] Int. Cl.$^6$ .................................................. G11C 16/06
[52] U.S. Cl. .............................. 365/185.23; 365/189.04
[58] Field of Search ........................ 365/185.23, 185.33, 365/230.06, 189.04, 230.03, 185.11

[56] References Cited

U.S. PATENT DOCUMENTS

| | | | |
|---|---|---|---|
| 4,599,708 | 7/1986 | Schuster | 365/189.04 |
| 5,077,691 | 12/1991 | Haddad et al. | 365/218 |
| 5,233,565 | 8/1993 | Wang | 365/230.06 |
| 5,337,281 | 8/1994 | Kobayashi et al. | 365/218 |
| 5,361,343 | 11/1994 | Kosonocky et al. | 365/189.04 |
| 5,369,619 | 11/1994 | Ohba | 365/230.06 |
| 5,416,738 | 5/1995 | Shrivastava | 365/185 |
| 5,469,384 | 11/1995 | Lacey | 365/185.13 |
| 5,485,423 | 1/1996 | Tang et al. | 365/185 |

*Primary Examiner*—Tan T. Nguyen
*Attorney, Agent, or Firm*—Flehr Hohbach Test Albritton & Herbert LLP

[57] ABSTRACT

A flash memory address decoder includes a plurality of voltage terminals to receive a plurality of voltages, an address terminal to receive a plurality of address signals and a procedure terminal to receive a procedure signal. A block decoder is coupled to the address terminal and configured to decode a portion of the address signals to provide a block select signal. A wordline decoder is coupled to the address terminal and configured to decode a portion of the address signals to provide a wordline select signal. A wordline selector circuit is coupled to the block decoder and the wordline decoder and configured to receive the block select signal and the wordline select signal and to activate addressed wordlines, where the wordline selector is configured to selectively activate addressed wordlines in the flash transistor array and to provide at least two different operational voltages simultaneously on different wordlines in the flash transistor array to accomplish a predetermined procedure responsive to the procedure signal. In one embodiment, a the address decoder includes a latch structure that latches addressed wordlines and provides operational voltages to the wordlines. In another embodiment, the block decoder and wordline decoder include latch structures that latch the block select signal and the wordline select signal to provide operational voltages to the wordline selector. Advantages of the invention include high accuracy and flexibility to read, erase and program the flash memory.

38 Claims, 19 Drawing Sheets

SELECTED   DESELECTED (7) DETECT VT MIN. FOR OPTIMIZING PROGRAM CONDITION (8) OPTIMAL POSITIVE-VT PROGRAM CONDITION (9) POSITIVE-VT PROGRAM-VERIFY CONDITION

|   | SELECTED | DESELECTED (POSITIVE VT) | DESELECTED (NEGATIVE VT) |
|---|---|---|---|

(1) DETECT VT MAX. FOR OPTIMIZING ERASE CONDITION (2) OPTIMAL ERASE CONDITION (3) DETECT VT MIN. OF OVER-ERASED CELLS

|  | SELECTED | DESELECTED (POSITIVE VT) | DESELECTED (NEGATIVE VT) |

(4) ERASE-VERIFY CONDITION (5) OPTIMAL NEGATIVE-VT PROGRAM CONDITION (6) NEGATIVE-VT PROGRAM-VERIFY CONDITION

|   |   |   | SELECTED | DESELECTED (POSITIVE VT) |
|---|---|---|---|---|
| (7) | DETECT VT MIN. FOR OPTIMIZING PROGRAM CONDITION | RAMP FROM GND TO + MV | + LV / GND | + LV / GND / GND |

FIG.2G (8) OPTIMAL POSITIVE-VT PROGRAM CONDITION — Selected: +MV / OPTIMAL +HV / GND. Deselected: +MV / GND, GND / OPTIMAL +HV / GND.

FIG.2H (9) POSITIVE-VT PROGRAM-VERIFY CONDITION — Selected: +LV / GND, Vg(PP) / GND. Deselected: +LV / GND, GND / GND.

FIG.2I

| | LATCH1 | LATCH2 | IN1 | VS | V1 | V2 | V3 |
|---|---|---|---|---|---|---|---|
| ERASE INITIALIZATION | L | L | H | GND | VDD | GND | GND |
| ERASE SELECT | H | H | L | GND | VDD | GND | GND |
| ERASE | L | L | L | GND | GND | <min.$V_{Tcell}$ | -HV |
| PROGRAM INITIALIZATIO | L | L | H | VDD | VDD | GND | GND |
| PROGRAM | H | H | L | VDD | +HV | GND | GND |
| READ INITIALIZATION | L | L | H | VDD | VDD | GND | GND |
| READ | H | H | L | VDD | VDD | GND | GND |

TABLE 2

|  | ISO | ISOB | SET1 | SET2 | VS | V1 | V2 | V3 |
|---|---|---|---|---|---|---|---|---|
| ERASE RESET | H | L | H | H | VDD | VDD | GND | GND |
| ERASE SELECT | H | L | H | H | GND | VDD | GND | GND |
| ERASE | L | H | L | L | GND | GND | < Vt min. | - HV |
| PROGRAM SELECT | H | L | H | H | VDD | VDD | GND | GND |
| PROGRAM | L | H | L | L | VDD | + HV | VDD | VDD |
| READ | H | L | L | L | GND | VDD | GND | GND |

TABLE 3

FLASH MEMORY ADDRESS DECODER WITH NOVEL LATCH STRUCTURE

REFERENCE TO RELATED APPLICATIONS

This is a continuation-in-part of U.S. Ser. No. 08/624,322 filed Mar. 29, 1996 (A-62384) now U.S. Pat. No. 5,646,890, U.S. Ser. No. 08/645,630 filed May 14, 1996 (A-63360) now U.S. Pat. No. 5,687,121, U.S. Ser. No. 08/676,066 filed Jul. 5, 1996 (A-63566); U.S. Ser. No. 08/726,670 filed Oct. 7, 1996 (A-63855) now U.S. Pat. No. 5,682,350; Provisional Ser. No. 60034,602 filed Jan. 3, 1997 (P-64137); and U.S. Ser. No. 08/779,765 filed Jan. 7, 1997 abandoned, which are herein by reference.

FIELD

The present invention relates to a flash memory address decoder with a novel latch structure and intelligent erase and program procedures.

BACKGROUND

Flash memories are well known in the art. However, the ability to control the read, erase and program procedures of flash memories is not well developed. One reason for the lack of development is that flash memories require many different voltage levels applied to the cells for the read, erase and program procedures. An example of a conventional flash memory cell and conventional voltages applied to the cells for the various procedures is given by reference to Yim et al, U.S. Pat. No. 5,109,361.

One limitation of flash memories is the inconvenience caused by a fixed erase size. Many techniques have been introduced to control the flash memory read, erase and program procedures, but up to now, no known technique has been able to provide the requisite amount of flexibility. Some known flash memories erase one wordline at a time, which results in extraordinarily long erase times to erase large portions of memory. Other known flash memories erase a block at a time, which results in re-writing those locations of memory where the data is to be retained, and requires extended periods of time to reprogram the entire block.

Another limitation of flash memories is current leakage problems caused by overerased or undererased cells. With overerased cells, current leakage often leads to a circumstance where the memory is unable to tell whether a cell is on or off because the overerased cell is permanently on and cannot be shut off. This problem can lead to false memory readings in NOR plane arrays, which are a very popular type of flash memory arrays. An undererased cell is one that has a voltage threshold (Vt) greater than that of a properly erased cell (e.g. above 2.5 V). In a conventional flash memory, the erase procedure and program procedure are collective procedures and are usually preceded by a preprogram procedure. Each cell's Vt is not sensed or checked to determine that status of the cell's Vt. Therefore, conventional flash memories may need to perform the erase procedure again to insure that all the cells are erased and do not provide a false reading. Then, conventional flash memories will perform a repair procedure to raise the Vt of those cells that become overerased.

What is needed is a technique that provides high accuracy and flexibility to read, program and erase selected portions of a flash memory.

SUMMARY

In summary, an embodiment of a flash memory address decoder includes a plurality of voltage terminals to receive a plurality of voltages, an address terminal to receive a plurality of address signals and a procedure terminal to receive a procedure signal. A block decoder is coupled to the address terminal and configured to decode a portion of the address signals to provide a block select signal. A wordline decoder is coupled to the address terminal and configured to decode a portion of the address signals to provide a wordline select signal. A wordline selector circuit is coupled to the block decoder and the wordline decoder and configured to receive the block select signal and the wordline select signal and to activate addressed wordlines, where the wordline selector is configured to selectively activate addressed wordlines in the flash transistor array and to provide at least two different operational voltages simultaneously on different wordlines in the flash transistor array to accomplish a predetermined procedure responsive to the procedure signal.

In another embodiment, a divided bitline configuration is employed in the flash transistor array where the wordline decoder circuit is configured to provide control signals to isolate selected ones of said blocks.

In another embodiment, the address decoder includes a latch structure that latches addressed wordlines and provides operational voltages to the wordlines.

In another embodiment, the block decoder and wordline decoder include latch structures that latch the block select signal and the wordline select signal to provide operational voltages to the wordline selector.

In another embodiment, a double latch configuration is employed in the block decoder, wordline decoder and wordline selector to provide three different operational voltages simultaneously on different ones of the selected wordlines to accomplish a predetermined procedure responsive to the procedure signal. The double latch can be employed with either the non-divided bitline array or the divided bitline array.

In another embodiment, the conventional input address of the block decoder (most significant bits, e.g. the most significant byte, msb) and that of the wordline decoder (least significant bits, e.g. the least significant byte, lsb) are exchanged. The physically separated selected wordlines form a logical block that can be erased together.

Advantages of the invention include high accuracy and flexibility to read, erase and program the flash memory. Moreover, the erase and program procedures can be performed on a bit by bit basis to improve memory life by reducing stress on any selected cells.

DESCRIPTION OF THE FIGURES

Additional objects and features of the invention will be more readily apparent from the following detailed description and the pending claims when taken in conjunction with the drawings, in which:

FIGS. 2A–I are bias conditions illustrating voltage levels applied to the flash memory cells according to an embodiment of the invention;

DETAILED DESCRIPTION

A flash memory wordline decoder with a novel latch structure is important for the ability to provide flexibility to flash memory read, erase and program procedures. In order to accomplish these procedures, a variety of bias conditions are introduced. Then, a discussion of the flowchart operation of the bias conditions is provided. Exemplary embodiments of hardware structure are provided that support the procedures and provide the structure for the memory support circuits and the decoder and latch circuits. All electrical parameters are provided by example and may be varied with good results.

Bias Conditions

The bias conditions to accomplish the read, erase and program procedures are based on two embodiments. In the first embodiment, two different voltages are applied in the erase procedure. The voltage levels depicted in FIGS. 1A–I are bias conditions applied to the flash memory cells according to the first embodiment. In the second embodiment, three different voltages are applied in the erase procedure. The voltage levels depicted in FIGS. 2A–I are bias conditions applied to the flash memory cells according to the second embodiment. The erase and program procedures are described with reference to the flowcharts of FIGS. 3A–B. A detailed explanation of the bias conditions is explained in U.S. patent application Ser. No. 08/779,765, incorporated herein by reference.

Erase Procedure and Program Procedure

Figure 1A:
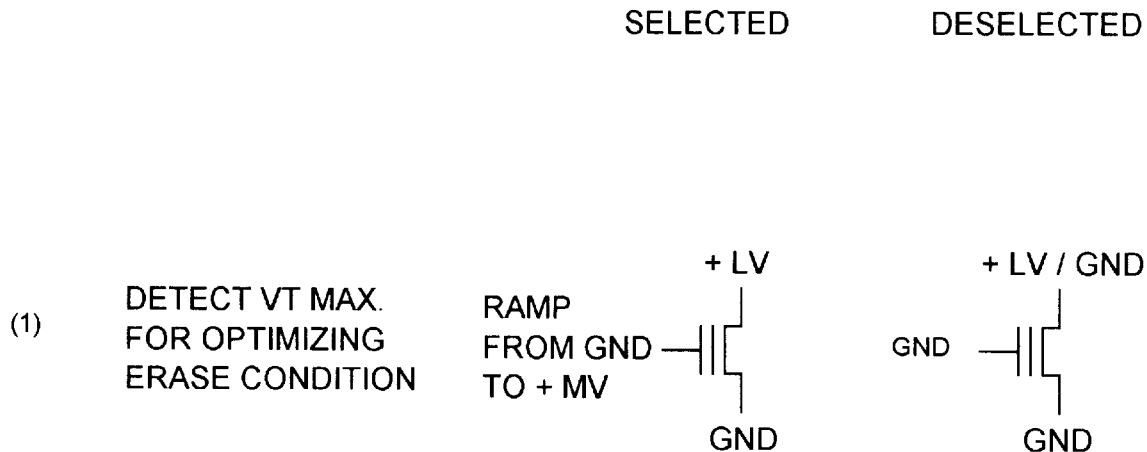
FIGS. 1A–I are bias conditions illustrating voltage levels applied to the flash memory cells according to an embodiment of the invention.
Figure 1B:
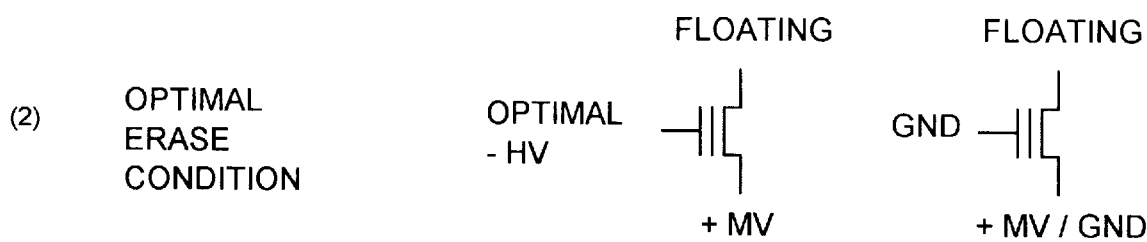
Figure 1C:
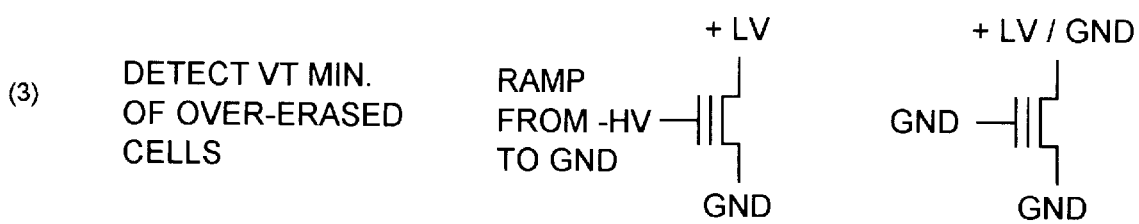
Figure 1D:
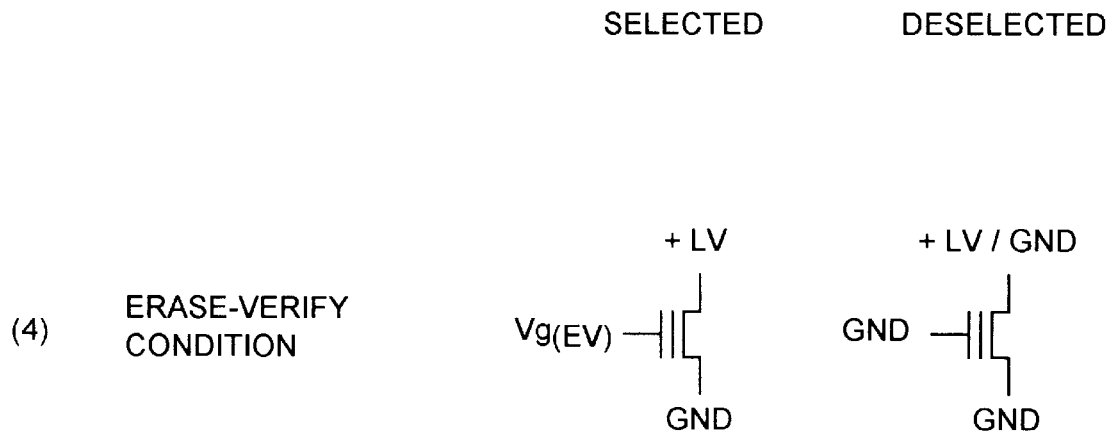
Figure 1E:
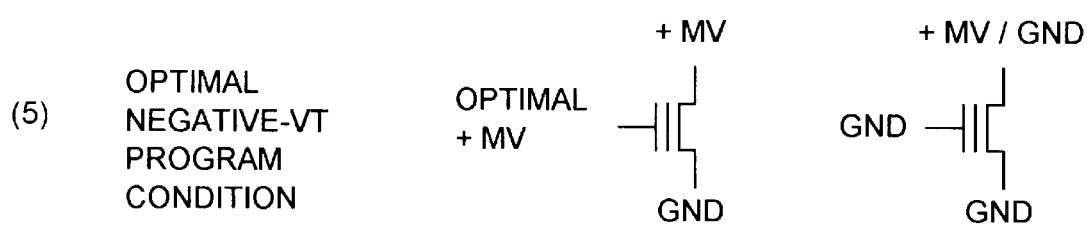
Figure 1F:
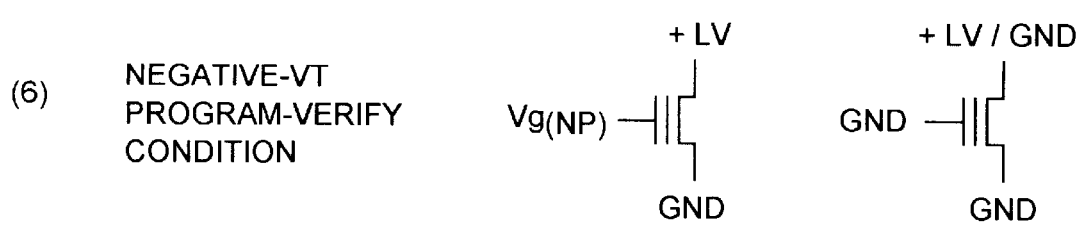
Figure 1G:
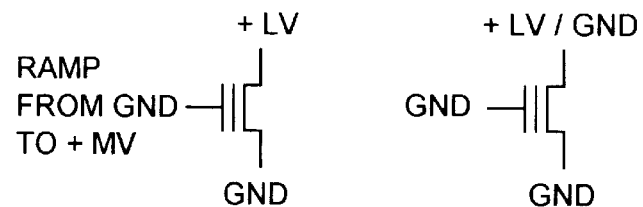
Figure 1H:
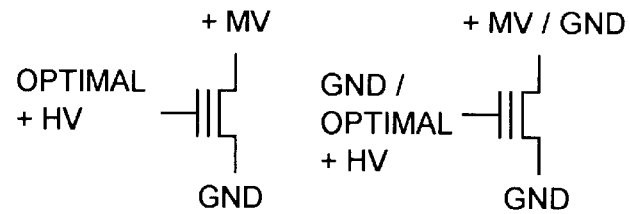
Figure 1I:
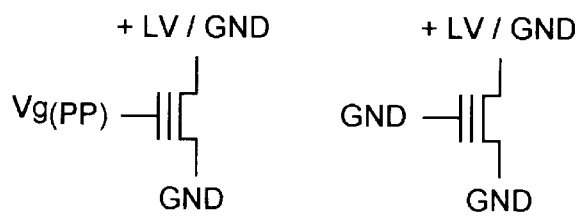
Figure 2A:
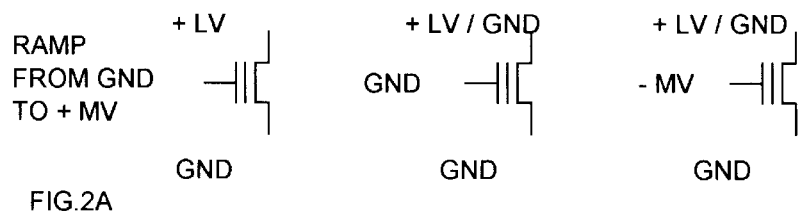
Figure 2B:
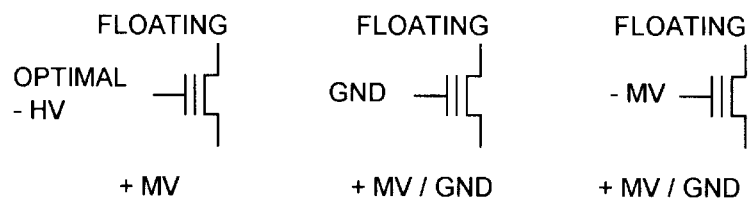
Figure 2C:
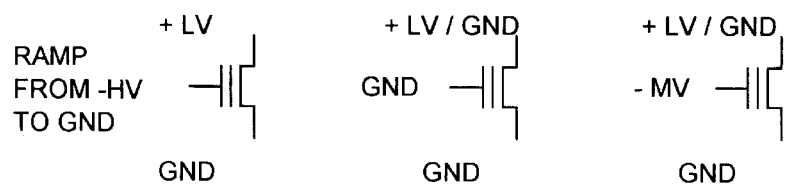
Figure 2D:
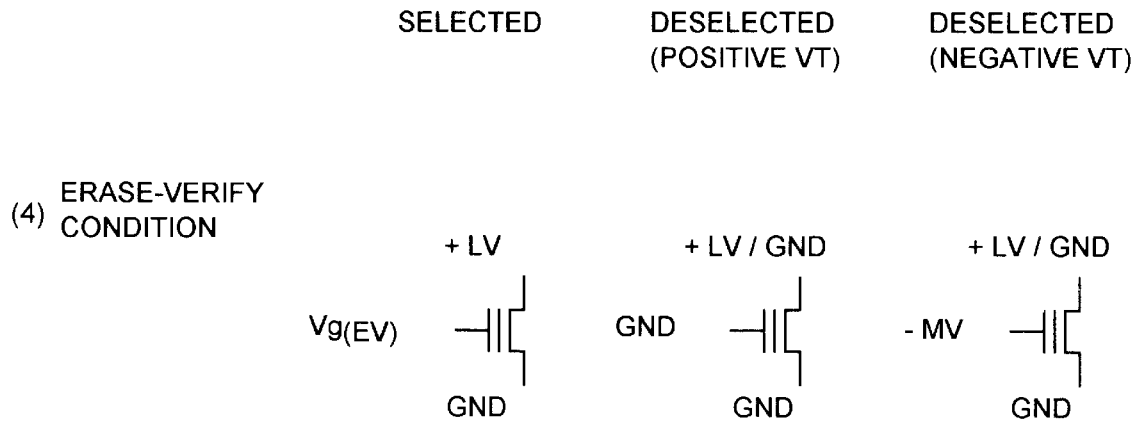
Figure 2E:
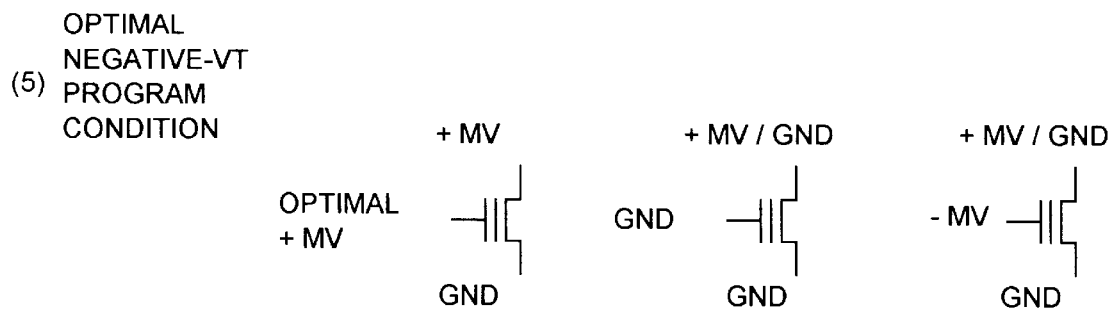
Figure 2F:
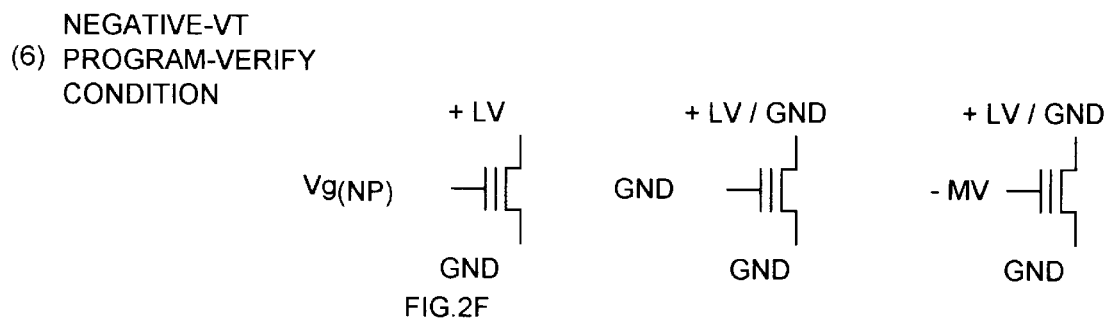
Figure 3A:
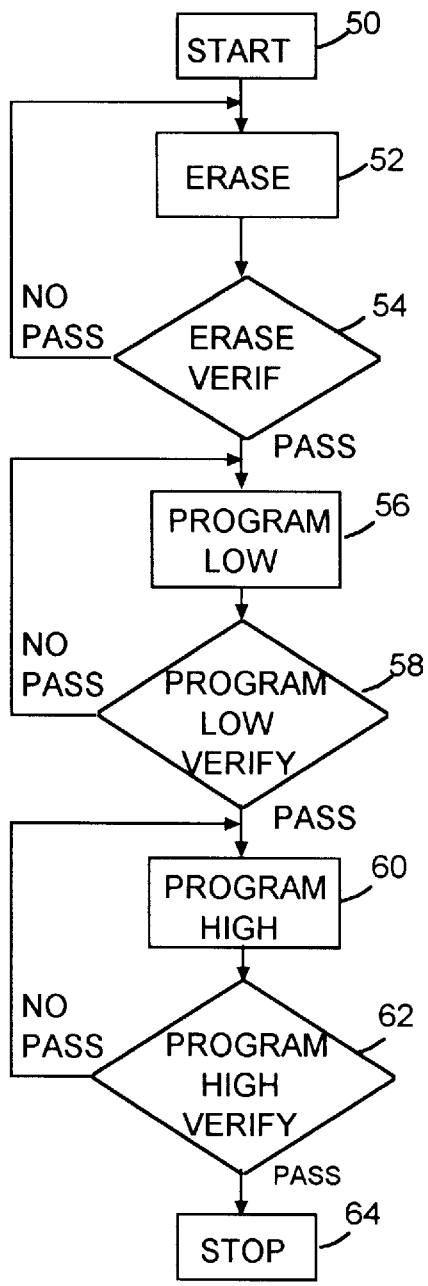
FIGS. 3A–B are flowcharts showing the steps to perform the erase procedure and program procedure according to embodiments of the invention.
Figure 3B:
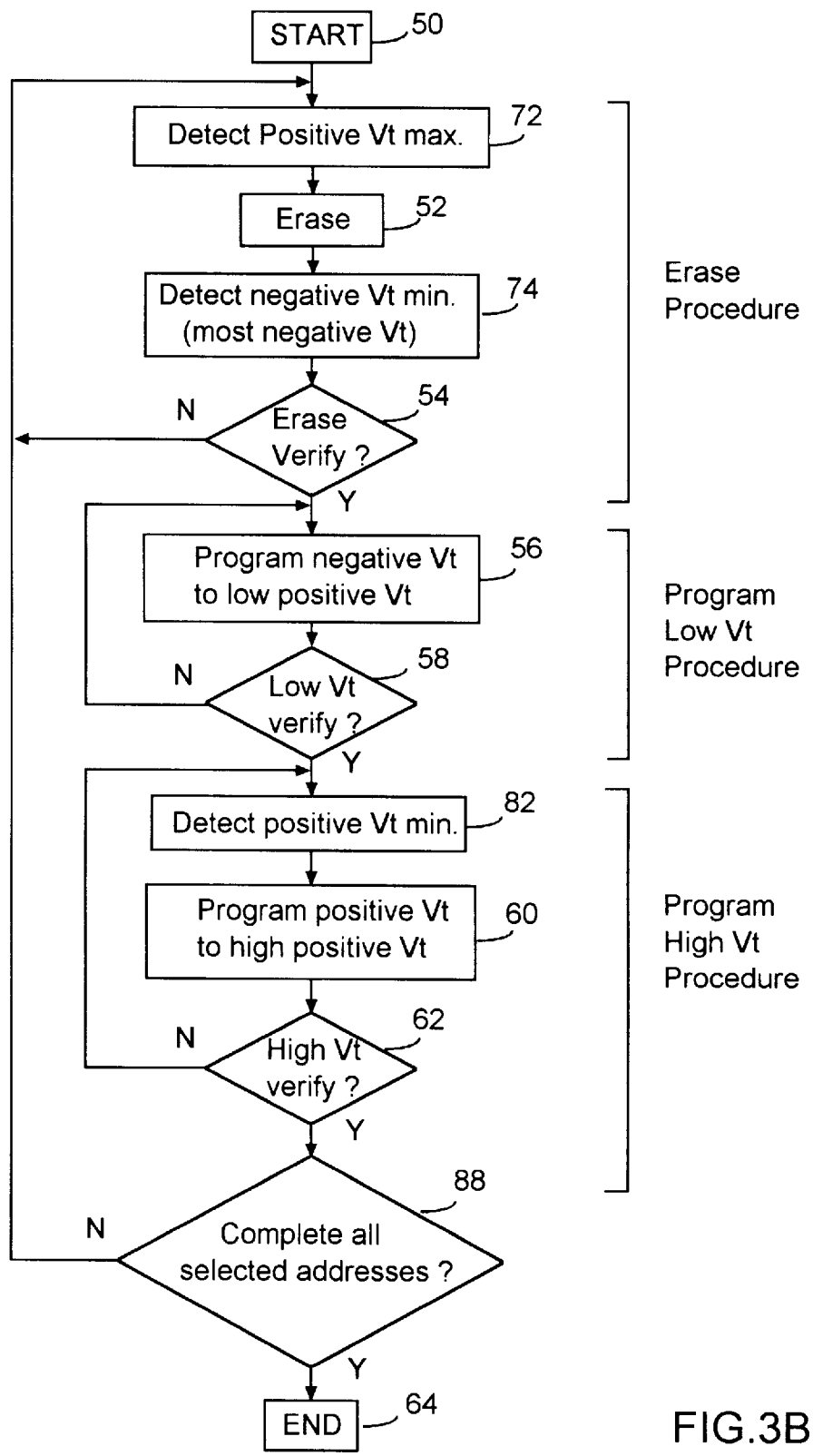

FIGS. 3A–B are flowcharts showing the steps to perform the erase procedure and program procedure according to embodiments of the invention. The FIG. 3A flowchart begins with step 50. In step 52, the selected cells are identified and an erase is performed according to the erase bias voltages are applied to the flash cells. The erase bias voltages are shown in FIGS. 1A–D and 2A–D. The conditions in FIGS. 1A, 1C, 1D and 2A, 2C and 2D are on a bit by bit basis, while the conditions in FIGS. 1B and 2B are on a collective basis. Once the erase step is completed, step 54 performs an erase verify step to determine whether the selected cells are properly erased. This step includes checking the voltage threshold for the selected cells. If the threshold of one or more of the selected cells is still not completely at the erased level, step 52 is performed again to erase those cells. Otherwise, the procedure follows to step 56.

Step 56 programs selected flash cells low. This is done according to the bias conditions from FIGS. 1E–F and FIGS. 2E–F and are performed on a bit by bit basis. Once the program low step is completed, step 58 performs a program low verify step to determine whether the selected cells are properly programmed. This step includes checking the voltage threshold for the selected cells. If the threshold of one or more of the selected cells is still not completely at the programmed low level, step 56 is performed again to program those cells low. Otherwise, the procedure follows to step 60.

Step 60 programs selected flash cells high. This is done according to the bias conditions from FIGS. 1G–I and FIGS. 2G–I and are performed on a bit by bit basis. Once the program high step is completed, step 62 performs a program high verify step to determine whether the selected cells are properly programmed. This step includes checking the voltage threshold for the selected cells. If the threshold of one or more of the selected cells is still not completely at the programmed high level, step 60 is performed again to program those cells low. Otherwise, the procedure follows to step 64, which indicates that the procedure is complete.

FIG. 3B includes additional steps for performing the erase procedure and program procedure. Step 72 detects the positive $V_t$ maximum. This is done according to the bias condition from FIGS. 1A and 2A. Step 74 detects the negative $V_t$ minimum. This is done according to the bias condition from FIGS. 1C and 2C. Step 82 detects the positive $V_t$ minimum. This is done according to the bias condition from FIGS. 1G and 2G. Step 88 checks to determine whether all the selected addresses have been erased and programmed. If the procedures are complete, then step 64 is performed to end the procedure. A detailed explanation of the erase and program features is explained in U.S. patent application Ser. No. 08/779,765, incorporated herein by reference.

Decoder Structure

A. Block Decoder, Wordline Decoder and Wordline Selector Structure

Figure 4:
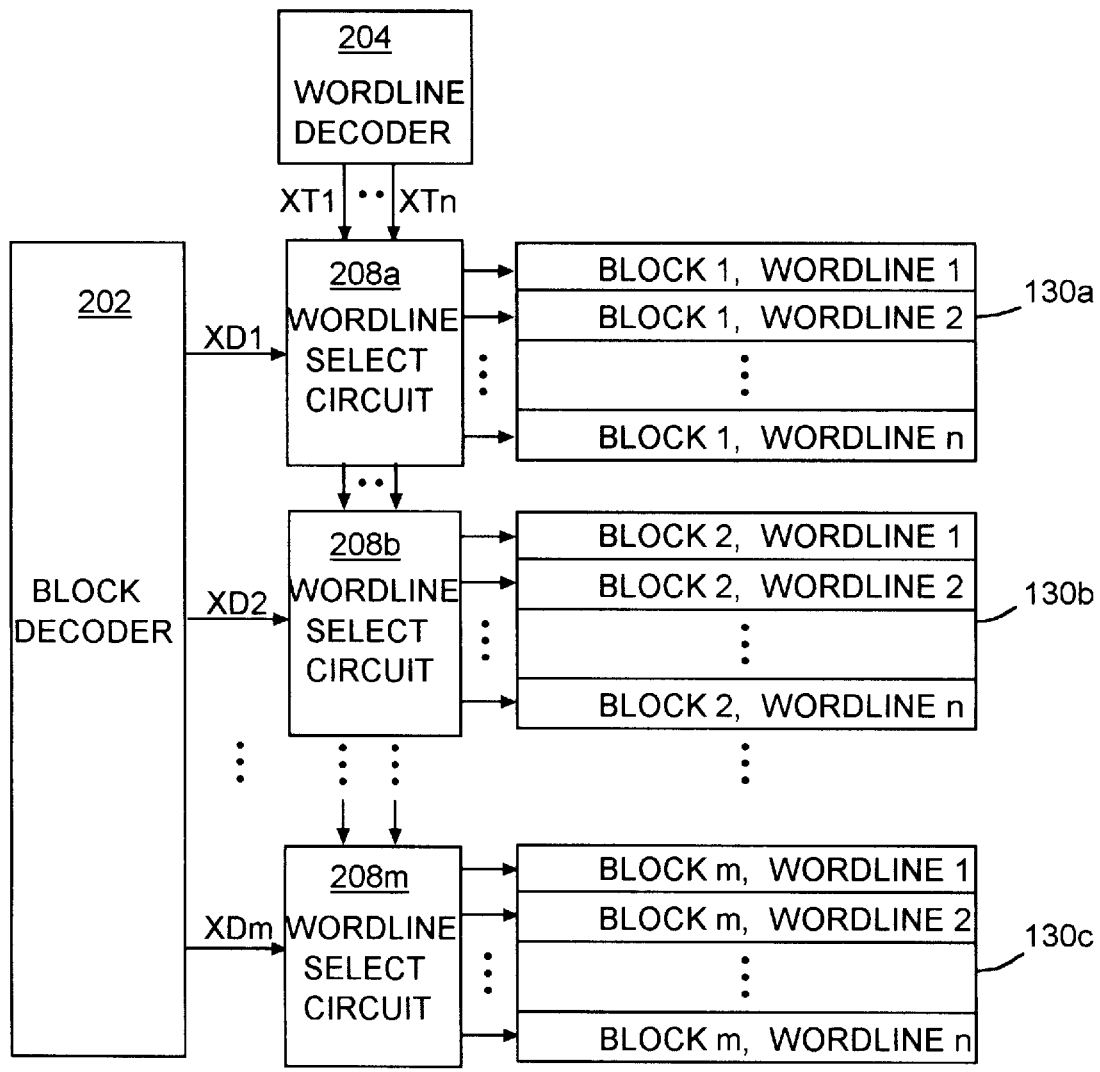
FIGS. 4A–B are block diagrams of a flash memory incorporating a block decoder, wordline decoder and wordline selector according to an embodiment of the invention.

FIG. 4A is a block diagram of a flash memory incorporating a block decoder 202, wordline decoder 204 and wordline selector 208a–m with a novel structure according to an embodiment of the invention. In this embodiment, a memory address is decoded by block decoder 202 and wordline decoder 204. The block decoder 202 receives the least significant bits (e.g. the least significant byte, lsb) of the address and is designed to have a block selection line XD1–XDm corresponding to each block 130a–130m. The wordline decoder 204 receives the most significant bits (e.g. the most significant byte, msb) of the address and is designed to have a selection line XT1–XTn corresponding to each wordline in the block. This allows the address decoder (collectively 202, 204 and 208a–208m) to divide up the selection circuit to improve efficiency.

Figure 4B:
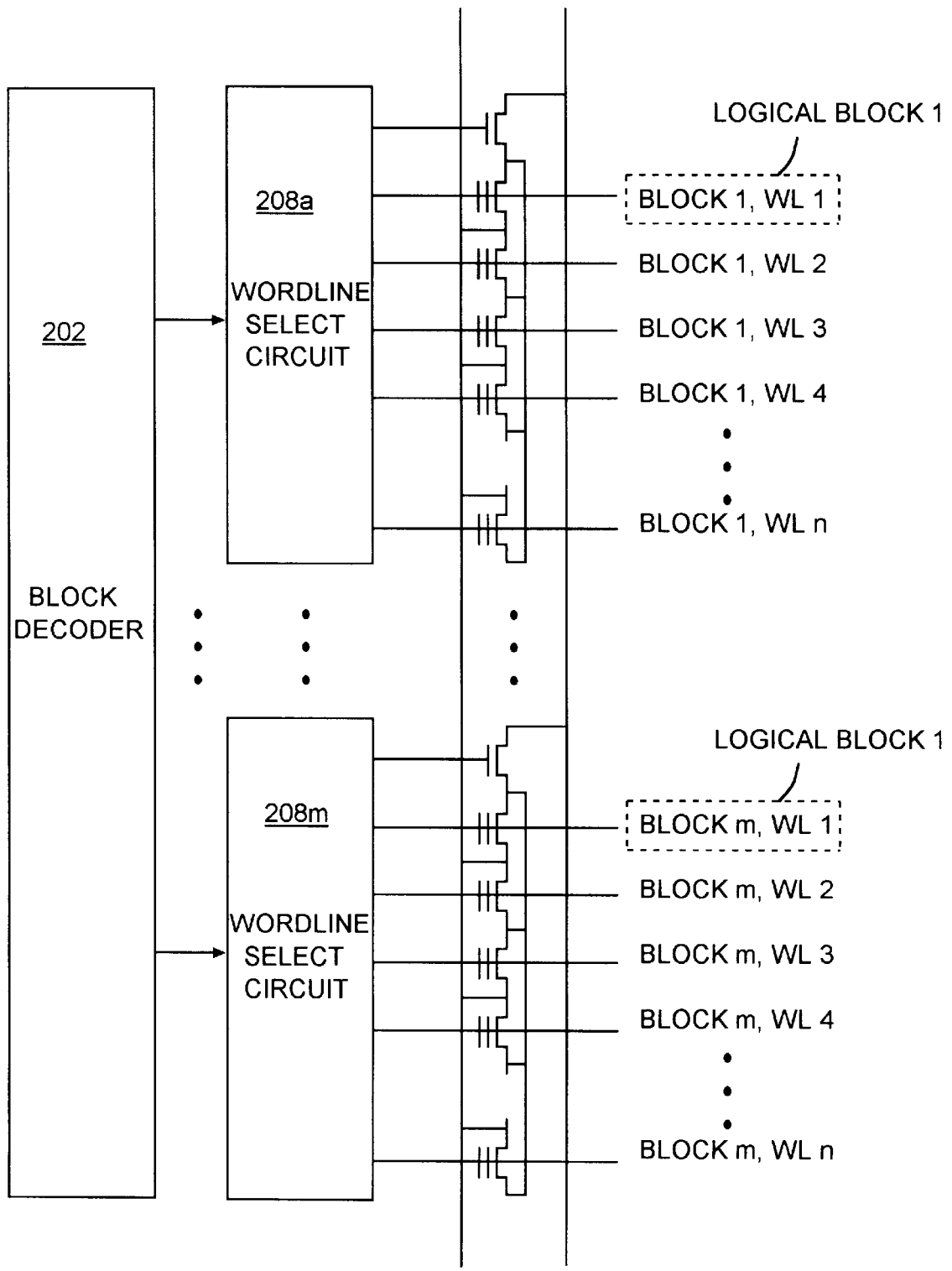

The control signals XD1–XDm select respective blocks 130a–130m and the controls signals XT1–XTn select respective wordlines in each block. When signal XD1 and XT1 are both active, the first wordline in the first block is selected by wordline selector 208a. Also, when all the signals XD1–XDm are activated and only XT1 is activated, the first wordlines in each of the blocks are selected. This is shown in FIG. 4B as logical block 1. This allows a logical group of wordlines to be defined as a group of similarly situated wordlines in each group. For example, all the first wordlines in the blocks or all the fifth wordlines in the blocks. As such, the groups of wordlines (a logical block) can be erased simultaneously.

Comparing this embodiment with conventional decoders, a conventional block decoder receives the most significant bits (e.g. the most significant byte, msb) of the address and the wordline decoder receives the least significant bits (e.g. the least significant byte, lsb) of the address. Therefore, when all the signals XT1–XTm are activated and only XD1 is activated, all the wordlines in the first physical block are selected. As such, all the wordlines in one block are selected and erased simultaneously. This is different from the inventive embodiment which selects specific wordlines from each physical block to form a logical block.

B. Divided Bitline Flash Transistor Array Structure

In another embodiment, a divided bitline configuration is employed in the flash transistor array where the wordline decoder circuit is configured to provide control signals to isolate selected ones of the blocks. An explanation of a divided bitline array is given in U.S. Ser. No. 08/726,670 filed Oct. 7, 1996 (Atty Docket No. A-63855). Essentially, the divided bitline configuration incorporates pass transistors that allow individual banks to be isolated from the bitline. For example, the flash transistor array of FIG. 4A can be constructed with a divided bitline. In that case, a control signal is provided from the block decoder to a block pass gate transistor to activate the selected transistor in the selected block.

In one aspect of this embodiment, the erase procedure is performed on groups of wordlines that share select lines XT1–XTn. For example, if the first wordlines in each block are to be erased (see FIGS. 4A–B), then the wordline selectors 208a–208m are each set by signal XT1 apply an erase voltage to the first wordline in each block. When the erase verify is performed, each block is iteratively isolated and the verification procedure can easily identify problem cells (which are overerased or undererased) because they are the only cells that are possibly on or off at the low erase verification voltage (assuming correctly that no other overerased cells exist in the block). To prevent more than one problem cell in the block, each selected wordlines in each block is individually erased (two wordlines within a single block are not recommended to be simultaneously erased because that may lead to an ambiguity in determining which cell is overerased).

C. Latch Structure

Figure 5:
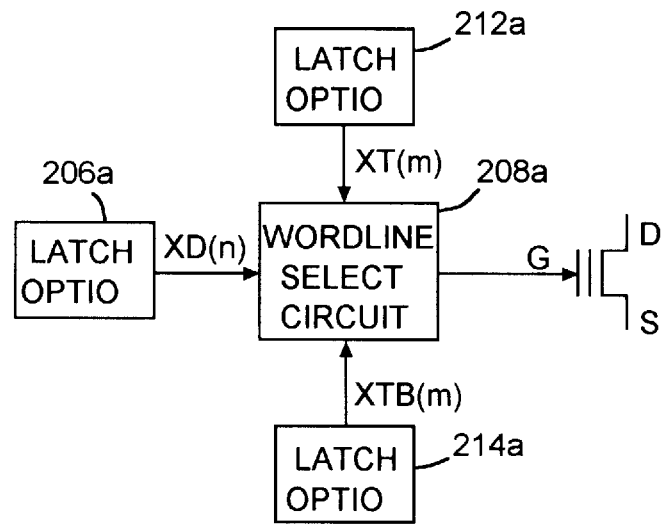
FIG. 5 is a block diagram of a wordline selector showing three inputs of various latch options according to embodiments of the invention.

FIG. 5 is a block diagram of a wordline selector 208a showing three inputs of various latch options according to embodiments of the invention. The latch options include a block decoder latch 206a and wordline decoder latches 212a and 214a. A single latch structure is described in U.S. Ser. No. 08/624,322 filed Mar. 29, 1996 (A-62384) and U.S. Ser. No. 08/645,630 filed May 14, 1996 (A-63360). A latch configuration is employed in the address decoder to provide a plurality of voltages that are applied simultaneously to the wordlines in order to achieve the desired procedure as described above with reference to the bias conditions FIGS. 1A–I.

Figure 6:
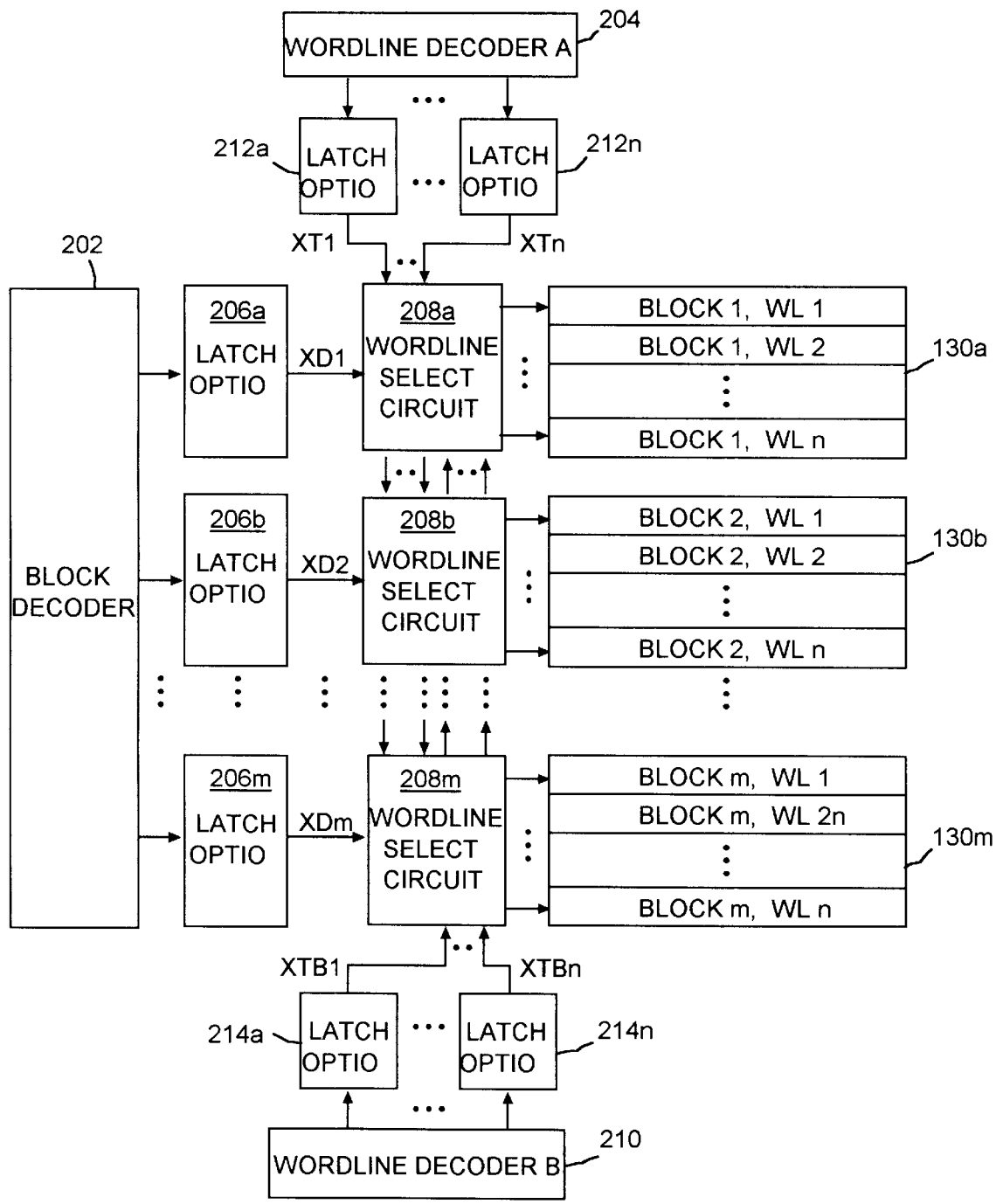
FIG. 6 is a block diagram of a wordline decoder with a block decoder latch structure and wordline decoder latch structure according to an embodiment of the invention.

FIG. 6 is a block diagram of a wordline decoder with a block decoder latch structure and wordline decoder latch structure according to an embodiment of the invention. This embodiment shows the placement of latch options 206a–206m, 212a–212n and 214a–214n.

A multi latch configuration is employed in the address decoder in order to provide three different operational voltages simultaneously on different ones of the selected wordlines to accomplish a the desired procedure as described above with reference to the bias conditions FIGS. 2A–I. An explanation of a multi latch configuration is given in U.S. Ser. No. 08/676,066 filed Jul. 5, 1996 (Atty Docket No. A-63566). Essentially, the double latch configuration incorporates two latches so that three different voltages can be simultaneously applied to different ones of the selected wordlines as depicted in Table 1. The output voltage levels are such that V1<V2<V3.

TABLE 1

| Logic Level | | Voltage Level |
| --- | --- | --- |
| Latch 1 | Latch 2 | Output |
| H | H | V1 |
| L | H | V2 |
| L | X | V3 |

The double latch can be employed with either the non-divided bitline array or the divided bitline array.

The tradeoffs in the configuration of the address decoder are the space limitations. On the one hand, a latch can be provided for each wordline as described in U.S. Ser. No. 08/645,630 filed May 14, 1996 (A-63360). This provides the greatest degree of flexibility and control, but requires space for each latch. On the other hand, a latch can be provided for the blocks and not for the individual wordlines. This provides less flexibility but also requires less space. One aspect of the invention is that the identification of how to strategically position the various latches to provide an optimal flexibility/space tradeoff is based on the application and the degree of flexibility required for the application. If, for example, a high degree of flexibility is desired, a large number of latches may be employed in the wordline selectors. However, if a lower degree of flexibility is desired, the latches may be employed in fewer numbers or in the block decoder.

D. Wordline Selector Structure

Figure 7:
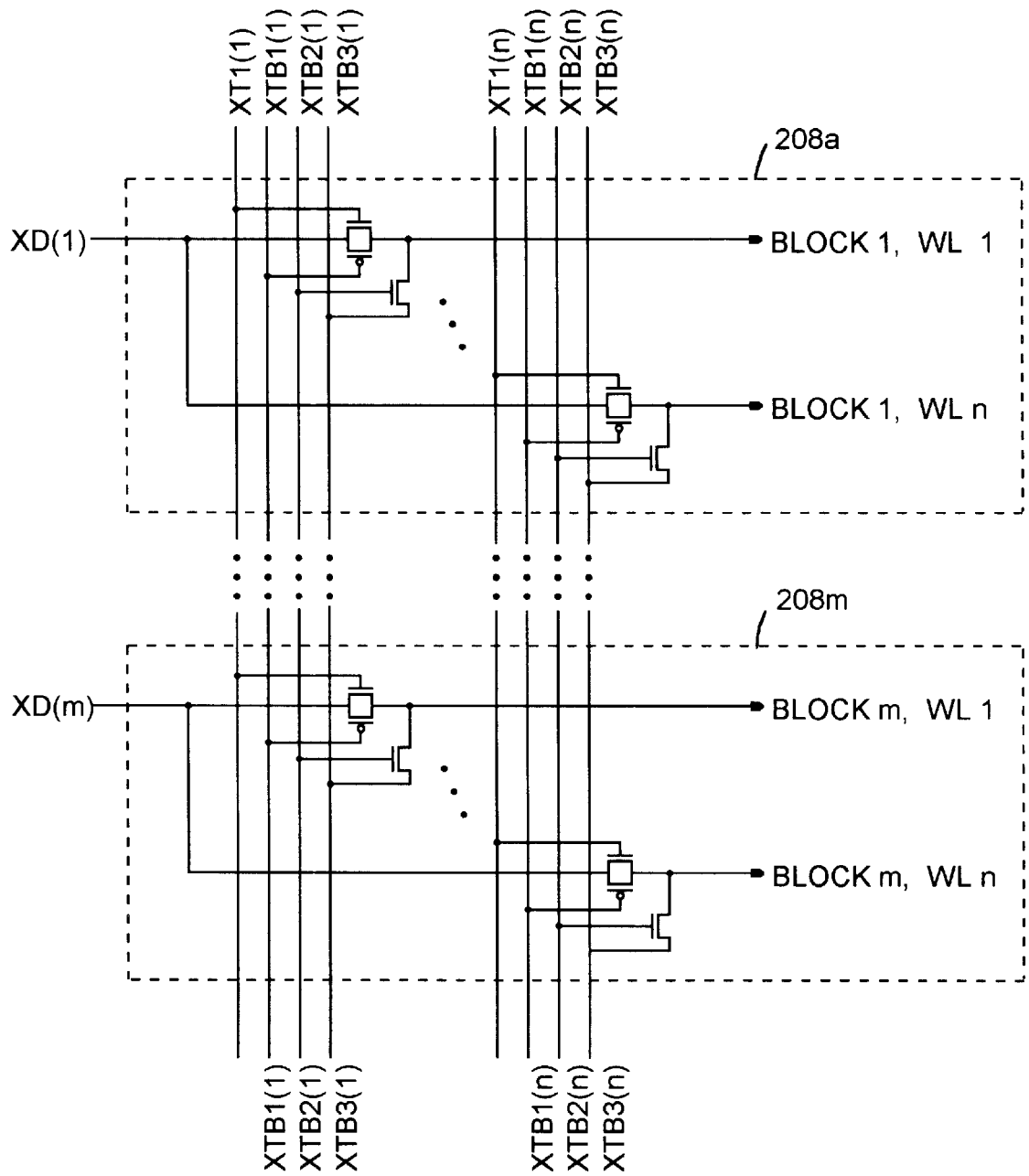
FIG. 7 is a schematic of a wordline selector configured to supply a selected wordline with one of a plurality of voltages according to an embodiment of the invention.

FIG. 7 is a schematic of a wordline selector configured to supply a selected wordline with one of a plurality of voltages from XD(m) according to an embodiment of the invention.

Figure 8:
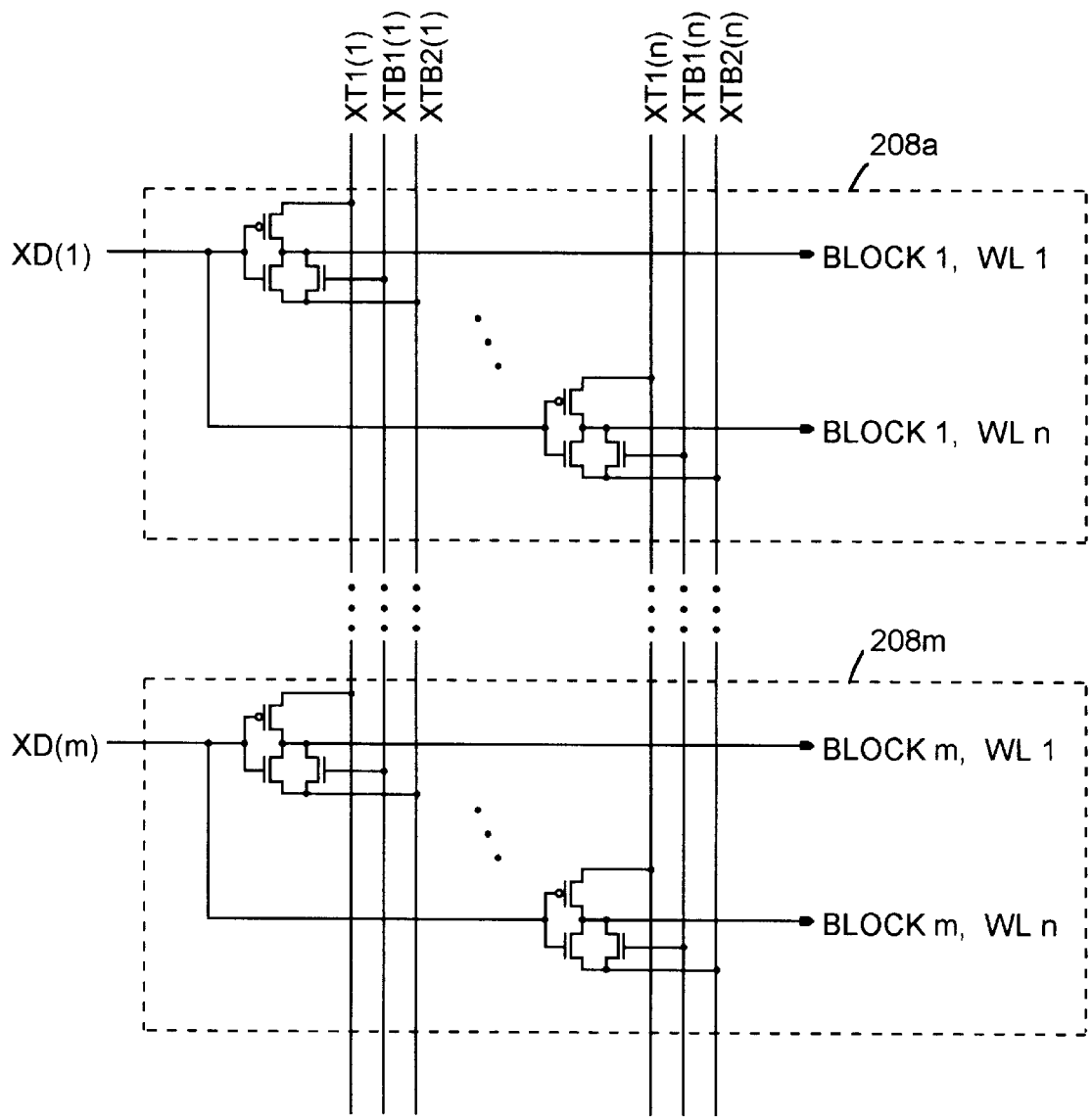
FIG. 8 is a schematic of a wordline selector configured to supply a selected wordline with one of a plurality of voltages according to an embodiment of the invention.

FIG. 8 is a schematic of a wordline selector configured to supply a selected wordline with one of a plurality of voltages from XT(n) or XTB(n) according to an embodiment of the invention.

E. Split Address Decoder and Latch Structure

Figure 9:
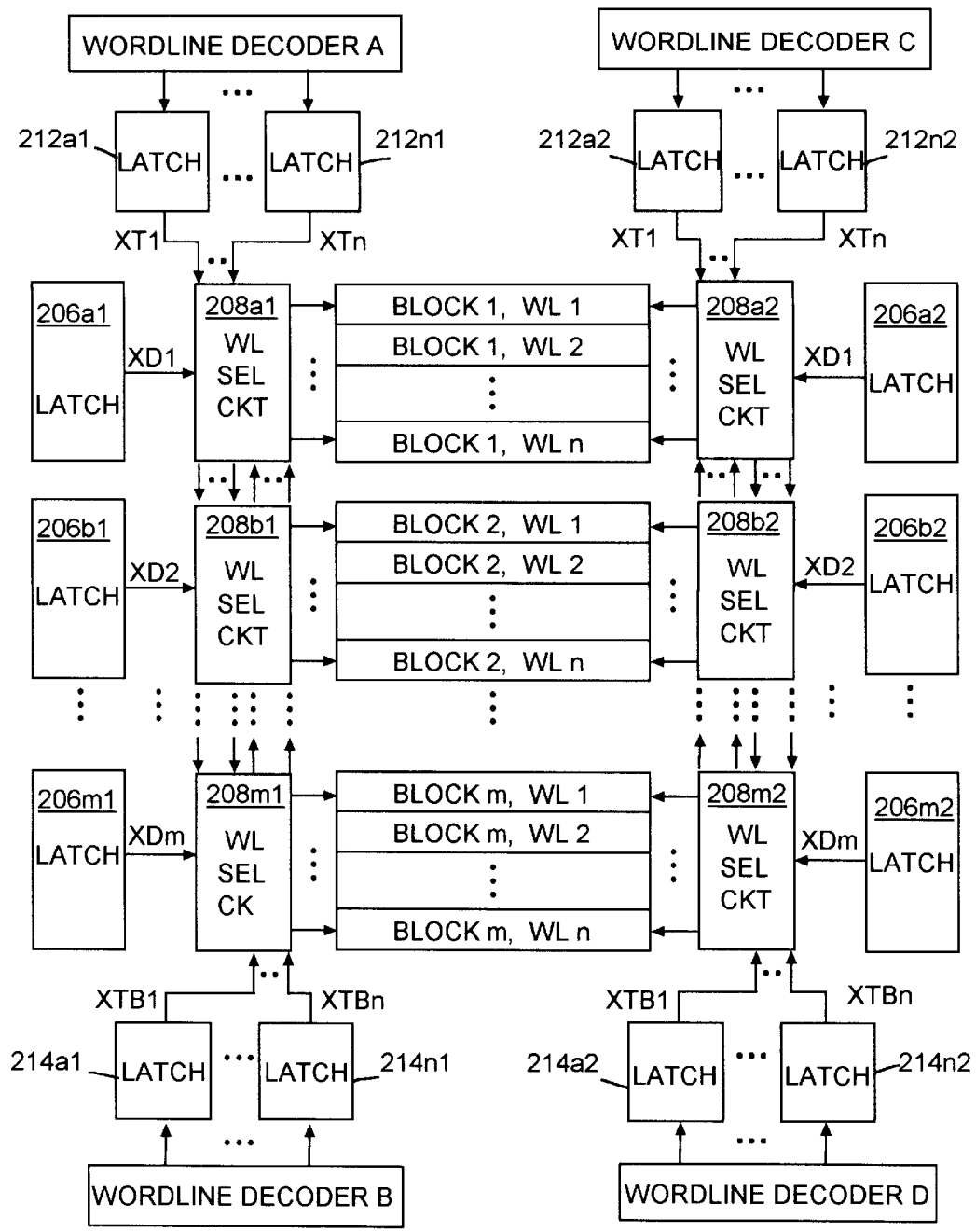
FIG. 9 is a block diagram of a flash memory incorporating a block decoder, wordline selector and wordline decoder with a novel latch structure according to an embodiment of the invention.

FIG. 9 is a block diagram of a flash memory incorporating block decoders, wordline decoders and wordline selectors with a novel latch structure according to an embodiment of the invention. As shown, the latch structure can be positioned apart from the decoder function. This is efficient because it permits the read procedure to operate quickly and does not provide any significant delay to the erase and program procedures. Moreover, the split address decoder provides more flexibility for the erase and program procedures since it provides the option to select the wordlines from the left side with selectors 208a1–208m1 or from the right with selectors 208a2–208m2. In one option, this allows some selected wordlines to be latched from the left selectors 208a1–208m1 and some deselected to be latched from the right selectors 208a2–208m2, or vice versa. Even without a divided bitline array, two or more wordlines in two or more blocks can be selected to be erased. This allows a bit by bit procedure to erase and program selected memory cells. Of course, the split address decoder can be employed with a divided bitline to achieve additional flexibility.

Additionally, the left and right decoders can be constructed differently for added flexibility. For example, wordline selectors 208a1–208m1 could be constructed similar to FIG. 7, while the wordline selectors 208a2–208m2 could be constructed similar to FIG. 8.

F. Double Decoder and Selector Structure

Figure 10A:
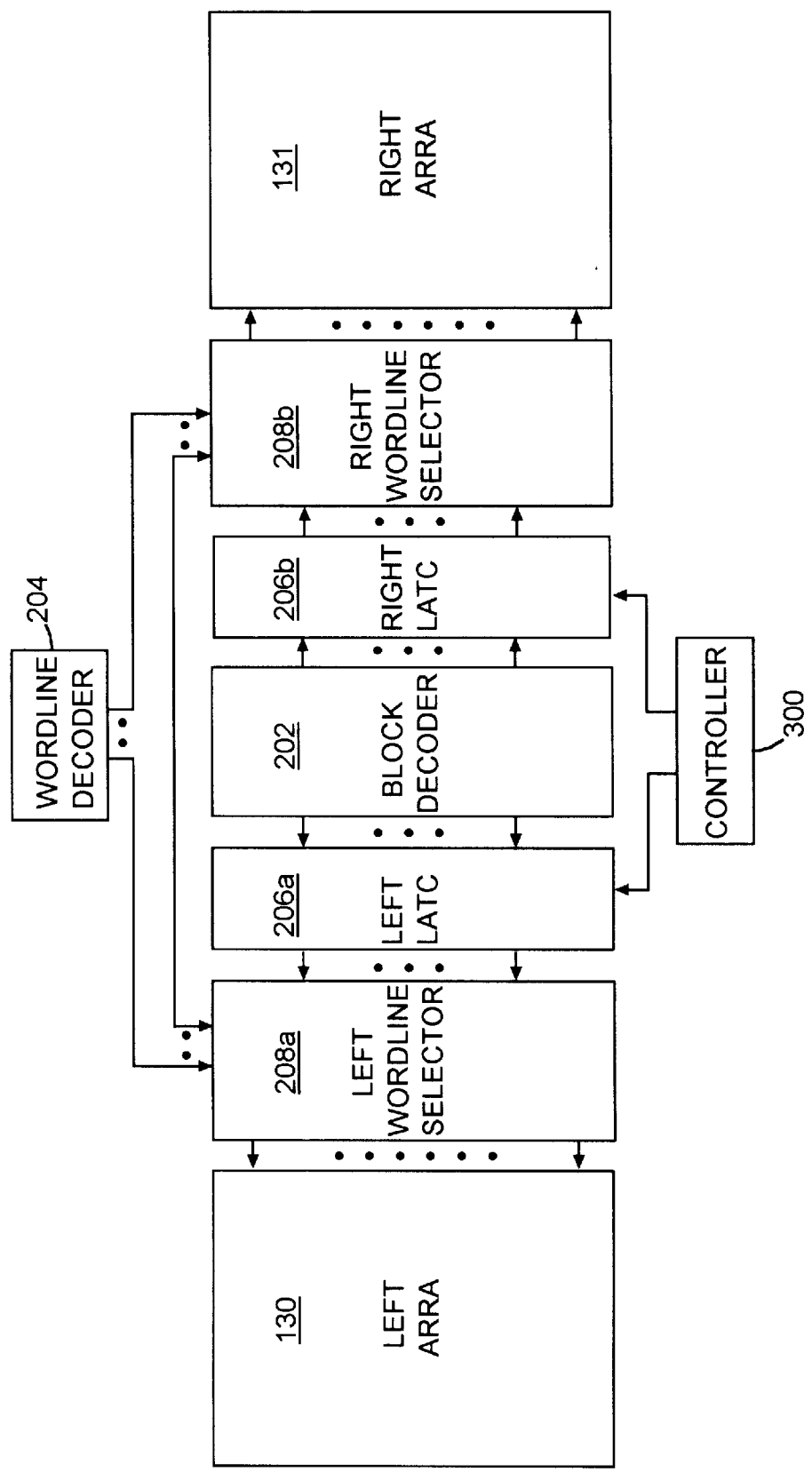
FIG. 10A depicts a double decoder and selector structure where the address decoder includes a left and right latch structure and a left and right wordline selector structure.

FIG. 10A depicts a flash memory with a double wordline selector structure. Block decoder 202 is similar to that described above, but it includes two outputs—a left output and a right output. The left output is delivered to left latch 206a and the right output is delivered to right latch 206b. The latches 206a, 206b are controlled by controller 300, which determines whether the latches are set or reset based on procedure signals. In the double decoder and selector structure, two procedure signals are used—one for the left array 130 and one for the right array 131. Since this embodiment has two flash transistor arrays, a first procedure can be performed on one array while a second procedure is simultaneously performed on the other array. For example, a portion of the left array 130 can be erased while a portion of the right array 131 is read, erased or programmed. This is one of the advantages of the double decoder architecture.

An explanation of the operation of the left latch 206a, left wordline selector 208a and left array 130 is now explained with the understanding that the corresponding right members operate similarly. Once the block decoder 202 selects and provides signals on the left output to left latch 206a, and the controller issues a latch signal, the left latch 206a will latch the asserted block decoder lines. The left wordline selector 208a then receives the signals from left latch 206a and wordline decoder 204. With these block lines latched and the wordlines selected, a predetermined procedure is performed in accordance with the procedure signal, similar to that described above with reference to FIG. 6.

In addition, the double decoder embodiment can also perform a procedure simultaneously on the right array 131. In order to perform a procedure on the right S array, the controller 300 deactivates (or suspends) the left latch 206a and activates the right latch 206b. If the controller suspends the left latch, and procedure being performed on the left array can continue (e.g. erase, program or read). When the right latch 206b is activated, the block decoder 202 provides signals to the right latch 206b, which may latch the signals. The wordline decoder 204 then provides signals to the right wordline selector 208b that selects the individual wordlines in right array 131. In this manner, the invention can perform procedures on both the left array and right array simultaneously. When the procedures are completed, the controller 300 resets the latches (if necessary) and the memory proceeds to perform the next required procedure.

Figure 10B:
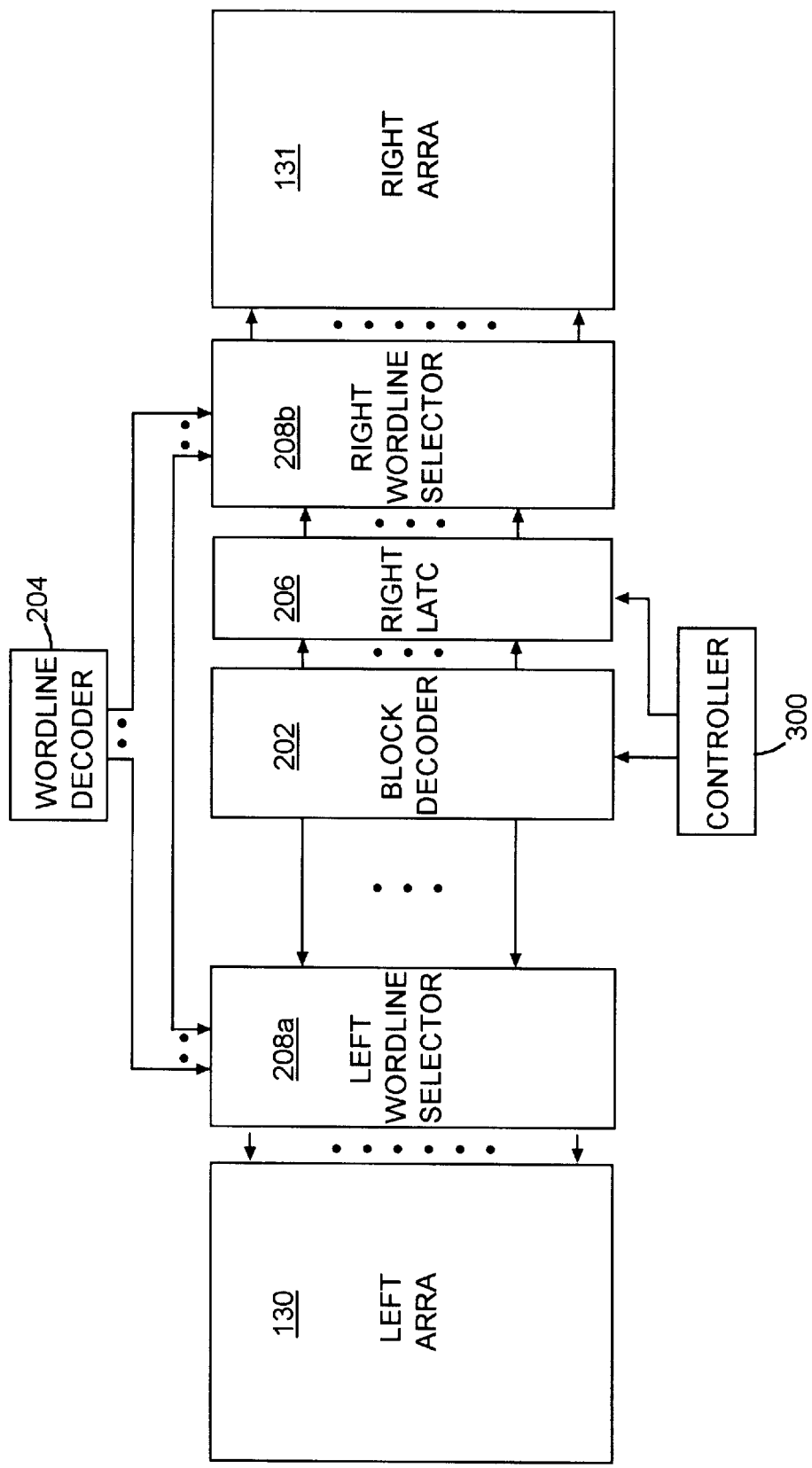
FIG. 10B depicts a double decoder and selector structure where the address decoder includes a single latch structure with a left and right wordline selector structure.

FIG. 10B depicts an embodiment similar to that of FIG. 10A, but having only one latch 206. In this embodiment, controller 300 is coupled to the block decoder 202 and the latch 206. When the block decoder provides a block line signal and the memory has instructions to latch that signal, the latch 206 provides the latch function. The latch 206 can hold the latched value on the block line and apply the value to one of the left and right arrays, or both, to perform a predetermined procedure (e.g. erase and program). Further, the block decoder can also provide a block line signal to the other array to perform a procedure that does not require a latched block line (e.g. read). In this manner, the invention can perform procedures on both the left array and right array simultaneously.

G. Three Level Wordline Voltage Source

Figure 11:
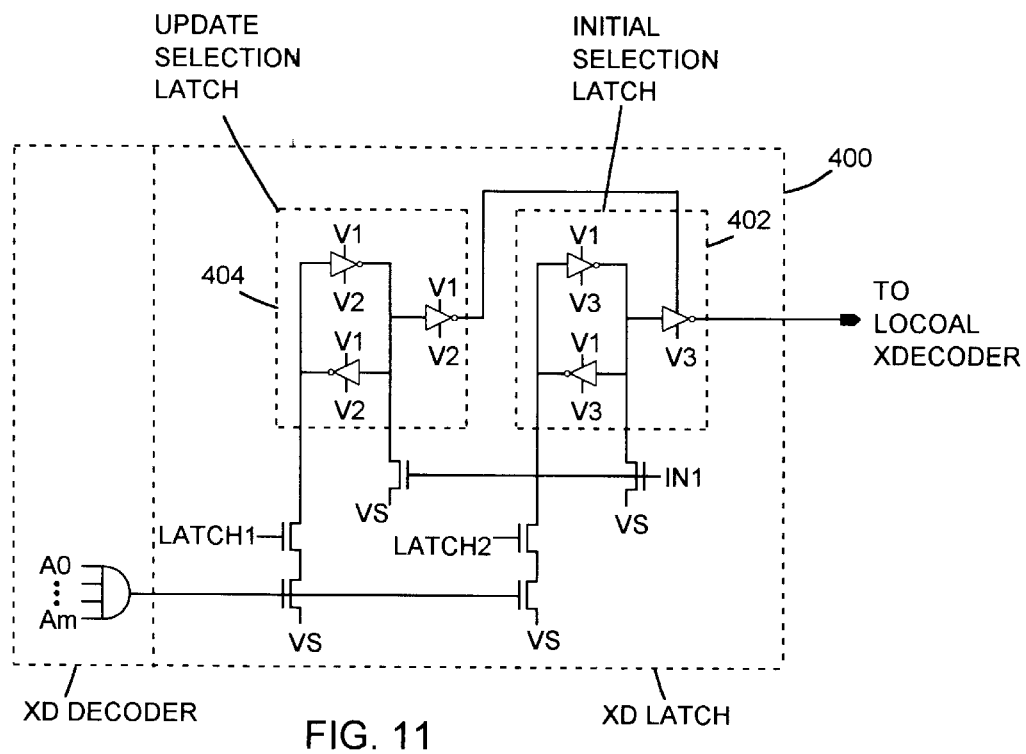
FIG. 11 is a schematic of a three level voltage source according to an embodiment of the invention.

FIG. 11 depicts a three level voltage source 400 according to an embodiment of the invention. Voltage source 400 includes two latches 402 and 404. Latch 402 is the driver latch that provides the voltage to the selected wordline. The latch 402 is the one that is initially set by the block line from block decoder 202. Latch 404 is a voltage control latch that provides an input voltage to the output driver of latch 402. If latch 402 is low, the latch 402 output driver is a low voltage V3 provided by the driver itself. If latch 402 is high, the latch 402 output driver is determined by latch 404. If latch 404 is low, the latch 402 output driver is a low voltage V2, while if latch 404 is high, the latch 402 output driver is a high voltage V1 provided by latch 404. Table 2 shows the various states for setting the voltage source 400.

Figure 12:
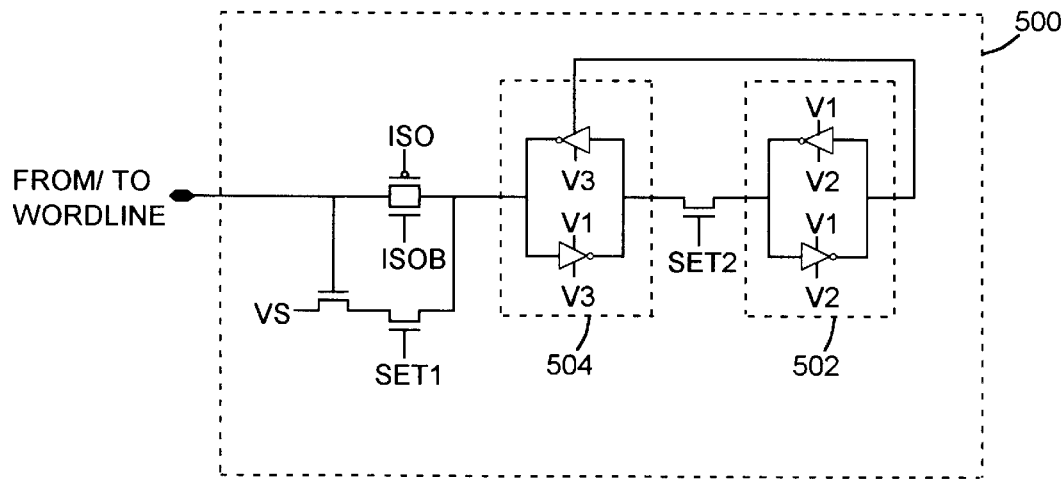
FIG. 12 is a schematic of a three level voltage source according to an embodiment of the invention.

FIG. 12 depicts a three level voltage source 500 according to an embodiment of the invention. Voltage source 500 has a similar basic structure as the voltage source 400. A significant difference between the voltage sources 500 and 400 is their respective locations in the address decoder structure. Voltage source 500 is located in each wordline, while voltage source 400 is located in each block. Therefore, voltage source 500 contains less circuitry in order to meet the small area requirement of the wordline pitch. Voltage source 500 requires larger area but provides greater flexibility that voltage source 400. This structure is a trade off between extreme flexibility of individual control over the wordlines and the space requirements of the control structure.

The voltage source 500 also includes two latches 502 and 504. Latch 502 is the driver latch that provides the voltage to the selected wordline. Latch 502 is the one that is initially set by the wordline driver. Latch 504 is a voltage control latch that provides an input voltage to the output driver of latch 502. The operation of latches 502 and 504 is similar to that of latches 402 and 404. Table 3 shows the various states for setting the voltage source 500.

Conclusion

Advantages of the invention include high accuracy and flexibility to read, erase and program the flash memory. Moreover, the erase and program procedures can be performed on a bit by bit basis to improve and memory life by reducing stress on any selected cells.

Having disclosed exemplary embodiments and the best mode, modifications and variations may be made to the exemplary embodiments while remaining within the scope of the invention as defined by the following claims.

What is claimed is:

1. A flash memory address decoder for use with a flash transistor array comprising:

a plurality of voltage terminals to receive a plurality of voltages;

an address terminal to receive a plurality of address signals;

a procedure terminal to receive a procedure signal;

a block decoder coupled to said address terminal and having block decoder lines and configured to decode a portion of said address signals to provide a block select signal on a selected block decoder line;

a wordline decoder coupled to said address terminal and having wordline decoder lines configured to decode a portion of said address signals to provide a wordline select signal on a selected wordline decoder line; and a wordline selector circuit coupled to said block decoder and said wordline decoder and configured to receive said block select signal and said wordline select signal and to activate selected wordlines in selected blocks to provide at least two different operational voltages simultaneously on different wordlines in each of said selected blocks to accomplish a predetermined procedure responsive to said procedure signal.

2. The flash memory address decoder of claim 1, wherein:
said wordline selector includes a latch configured to latch selected wordlines and to provide said operational voltages on said selected wordlines to accomplish said predetermined procedure.

3. The flash memory address decoder of claim 2, wherein:
said wordline selector is configured to provide at least three different operational voltages simultaneously on different wordlines in each of said selected blocks to accomplish said predetermined procedure.

4. The flash memory address decoder of claim 2, further comprising:
a sense amplifier coupled to said flash transistor array and configured to sense current in selected cells; and
wherein:
said wordline selector is configured to apply a plurality of voltages on a selected wordline at different times;
said sense amplifier is configured to detect a voltage threshold of selected cells coupled to said selected wordline; and
said wordline selector is configured to apply an operational voltage on said wordline to perform said predetermined procedure, said operational voltage selected based at least in part on said voltage threshold.

5. The flash memory address decoder of claim 1, wherein:
said wordline selector is configured to provide at least three different operational voltages simultaneously on different wordlines in each of said selected blocks to accomplish said predetermined procedure.

6. The flash memory address decoder of claim 1, wherein:
said block decoder includes a latch configured to latch selected block decoder lines and to provide said operational voltages on said selected block decoder lines to accomplish said predetermined procedure.

7. The flash memory address decoder of claim 6, wherein:
said block decoder is configured to provide at least three different operational voltages simultaneously on different block decoder lines to accomplish said predetermined procedure.

8. The flash memory address decoder of claim 6, wherein:
said wordline decoder includes a latch configured to latch selected wordline decoder lines and to provide said operational voltages on said selected wordline decoder lines to accomplish said predetermined procedure.

9. The flash memory address decoder of claim 8, wherein:
said wordline decoder is configured to provide at least three different operational voltages simultaneously on different wordline decoder lines to accomplish said predetermined procedure.

10. The flash memory address decoder of claim 8, further comprising:
a sense amplifier coupled to said flash transistor array and configured to sense current in selected cells; and
wherein:
said wordline selector is configured to apply a plurality of voltages on a selected wordline at different times;
said sense amplifier is configured to detect a voltage threshold of selected cells coupled to said selected wordline; and
said wordline selector is configured to apply an operational voltage on said wordline to perform said predetermined procedure, said operational voltage selected based at least in part on said voltage threshold.

11. The flash memory of claim 8, wherein said flash transistor array includes a left transistor array and a right transistor array, and wherein:
said block decoder has left block decoder lines and right block decoder lines and a left latch associated with said left block decoder lines and a right latch associated with said right block decoder lines; and
said wordline selector includes a left wordline selector coupled to said left block decoder lines and configured to provide operational voltages to said left transistor array, and a right wordline selector coupled to said right block decoder lines and configured to provide operational voltages to said right transistor array.

12. The flash memory of claim 8, wherein said flash transistor array includes a left transistor array and a right transistor array, and wherein:
said block decoder has left block decoder lines and right block decoder lines; and
said wordline selector includes a left wordline selector coupled to said left block decoder lines and configured to provide operational voltages to said left transistor array, and a right wordline selector coupled to said right block decoder lines and configured to provide operational voltages to said right transistor array.

13. The flash memory address decoder of claim 6, wherein:
said wordline decoder is configured to provide at least three different operational voltages simultaneously on different wordline decoder lines to accomplish said predetermined procedure.

14. The flash memory address decoder of claim 6, further comprising:
a sense amplifier coupled to said flash transistor array and configured to sense current in selected cells; and
wherein:
said wordline selector is configured to apply a plurality of voltages on a selected wordline at different times;
said sense amplifier is configured to detect a voltage threshold of selected cells coupled to said selected wordline; and
said wordline selector is configured to apply an operational voltage on said wordline to perform said predetermined procedure, said operational voltage selected based at least in part on said voltage threshold.

15. The flash memory of claim 6, wherein said flash transistor array includes a left transistor array and a right transistor array, and wherein:
said block decoder has left block decoder lines and right block decoder lines and a left latch associated with said left block decoder lines and a right latch associated with said right block decoder lines; and
said wordline selector includes a left wordline selector coupled to said left block decoder lines and configured to provide operational voltages to said left transistor array, and a right wordline selector coupled to said right block decoder lines and configured to provide operational voltages to said right transistor array.

16. The flash memory of claim 6, wherein said flash transistor array includes a left transistor array and a right transistor array, and wherein:
said block decoder has left block decoder lines and right block decoder lines; and
said wordline selector includes a left wordline selector coupled to said left block decoder lines and configured to provide operational voltages to said left transistor array, and a right wordline selector coupled to said right block decoder lines and configured to provide operational voltages to said right transistor array.

17. The flash memory address decoder of claim 1, wherein:
said block decoder is configured to provide at least three different operational voltages simultaneously on different block decoder lines to accomplish said predetermined procedure.

18. The flash memory address decoder of claim 1, further comprising:
a sense amplifier coupled to said flash transistor array and configured to sense current in selected cells; and
wherein:
said wordline selector is configured to apply a plurality of voltages on a selected wordline at different times;
said sense amplifier is configured to detect a voltage threshold of selected cells coupled to said selected wordline; and
said wordline selector is configured to apply an operational voltage on said wordline to perform said predetermined procedure, said operational voltage selected based at least in part on said voltage threshold.

19. The flash memory address decoder of claim 1, wherein:
said block decoder includes a left block decoder configured to provide a left block select signal and a right block decoder configured to provide a right block select signal;
said wordline decoder includes a left wordline decoder configured to provide a left wordline decoder signal and a right wordline decoder configured to provide a right wordline decoder signal;
said wordline selector includes a left wordline selector coupled to said left block decoder and said left wordline decoder and configured to receive said left block select signal and said left wordline select signal and to activate selected wordlines, and a right wordline selector coupled to said right block decoder and said right wordline decoder and configured to receive said right block select signal and said right wordline select signal and to activate selected wordlines.

20. The flash memory address decoder of claim 19, wherein:
said left wordline selector includes a latch configured to latch selected wordlines and to provide said operational voltages on said selected wordlines to accomplish said predetermined procedure; and
said right wordline selector includes a latch configured to latch selected wordlines and to provide said operational voltages on said selected wordlines to accomplish said predetermined procedure.

21. The flash memory address decoder of claim 20, wherein:
said left block decoder includes a latch configured to latch selected block decoder lines and to provide said operational voltages on said selected block decoder lines to accomplish said predetermined procedure; and
said right block decoder includes a latch configured to latch selected block decoder lines and to provide said operational voltages on said selected block decoder lines to accomplish said predetermined procedure.

22. The flash memory address decoder of claim 20, further comprising:

a sense amplifier coupled to said flash transistor array and configured to sense current in selected cells; and
wherein:
said left wordline selector is configured to apply a plurality of voltages on a selected wordline at different times;
said sense amplifier is configured to detect a voltage threshold of selected cells coupled to said selected wordline; and
said left wordline selector is configured to apply an operational voltage on said wordline to perform said predetermined procedure, said operational voltage selected based at least in part on said voltage threshold; and
wherein:
said right wordline selector is configured to apply a plurality of voltages on a selected wordline at different times;
said sense amplifier is configured to detect a voltage threshold of selected cells coupled to said selected wordline; and
said right wordline selector is configured to apply an operational voltage on said wordline to perform said predetermined procedure, said operational voltage selected based at least in part on said voltage threshold.

23. The flash memory address decoder of claim 19, wherein:
said left block decoder includes a latch configured to latch selected block decoder lines and to provide said operational voltages on said selected block decoder lines to accomplish said predetermined procedure; and
said right block decoder includes a latch configured to latch selected block decoder lines and to provide said operational voltages on said selected block decoder lines to accomplish said predetermined procedure.

24. The flash memory address decoder of claim 19, further comprising:
a sense amplifier coupled to said flash transistor array and configured to sense current in selected cells; and
wherein:
said left wordline selector is configured to apply a plurality of voltages on a selected wordline at different times;
said sense amplifier is configured to detect a voltage threshold of selected cells coupled to said selected wordline; and
said left wordline selector is configured to apply an operational voltage on said wordline to perform said predetermined procedure, said operational voltage selected based at least in part on said voltage threshold; and
wherein:
said right wordline selector is configured to apply a plurality of voltages on a selected wordline at different times;
said sense amplifier is configured to detect a voltage threshold of selected cells coupled to said selected wordline; and
said right wordline selector is configured to apply an operational voltage on said wordline to perform said predetermined procedure, said operational voltage selected based at least in part on said voltage threshold.

25. A method of storing and retrieving information in a flash memory having a plurality of voltage terminals to receive a plurality of voltages, an address terminal to receive a plurality of address signals, a procedure terminal to receive a procedure signal, a block decoder, a wordline decoder and a wordline selector, comprising the steps of:

providing a plurality of voltages;

receiving a plurality of address signals;

receiving a procedure signal;

decoding a portion of said address signals in said block decoder and providing a block select signal on a selected block decoder line;

decoding a portion of said address signals in said wordline decoder and providing a wordline select signal on a selected wordline decoder line;

receiving said block select signal and said wordline select signal in said wordline selector, activating selected wordlines in selected blocks and providing at least two different operational voltages simultaneously on different wordlines in each of said selected blocks to accomplish a predetermined operation responsive to said procedure signal.

26. The method of claim 25, wherein:

said step of activating selected wordlines includes the step of latching selected wordlines to provide said operational voltages on said selected wordlines to accomplish said predetermined procedure.

27. The method of claim 26, wherein:

said step of providing at least two different operational voltages simultaneously on different wordlines is performed by providing at least three different operational voltages simultaneously on different wordlines.

28. The method of claim 26, wherein said flash memory decoder further comprises a sense amplifier coupled to said flash transistor array and configured to sense current in selected cells, further comprising the steps of:

applying a plurality of voltages on a selected wordline at different times;

detecting a voltage threshold of selected cells coupled to said selected wordline in said sense amplifier; and applying an operational voltage on said selected wordline to perform said predetermined procedure, said operation voltage selected based at least in part on said voltage threshold.

29. The method of claim 25, wherein:

said step of providing at least two different operational voltages simultaneously on different wordlines is performed by providing at least three different operational voltages simultaneously on different wordlines.

30. The method of claim 25, wherein:

said step of activating a selected block decoder line includes the step of latching said selected block decoder line to provide said block decoder signal on said selected block decoder line.

31. The method of claim 30, wherein:

said step of providing a block select signal on a selected block decoder line includes the step of providing at least three different operational voltages on said selected block decoder line.

32. The method of claim 30, wherein:

said step of activating a selected wordline decoder line includes the step of latching said selected wordline decoder line to provide said wordline decoder signal on said selected wordline decoder line.

33. The method of claim 32, wherein:

said step of providing a wordline select signal on a selected wordline decoder line includes the step of providing at least three different operational voltages on said selected wordline decoder line.

34. The method of claim 32, wherein said flash memory decoder further comprises a sense amplifier coupled to said flash transistor array and configured to sense current in selected cells, further comprising the steps of:

applying a plurality of voltages on a selected wordline at different times;

detecting a voltage threshold of selected cells coupled to said selected wordline in said sense amplifier; and applying an operational voltage on said selected wordline to perform said predetermined procedure, said operation voltage selected based at least in part on said voltage threshold.

35. The method of claim 30, wherein:

said step of providing a wordline select signal on a selected wordline decoder line includes the step of providing at least three different operational voltages on said selected wordline decoder line.

36. The method of claim 30, wherein said flash memory decoder further comprises a sense amplifier coupled to said flash transistor array and configured to sense current in selected cells, further comprising the steps of:

applying a plurality of voltages on a selected wordline at different times;

detecting a voltage threshold of selected cells coupled to said selected wordline in said sense amplifier; and applying an operational voltage on said selected wordline to perform said predetermined procedure, said operation voltage selected based at least in part on said voltage threshold.

37. The method of claim 25, wherein:

said step of providing a block select signal on a selected block decoder line includes the step of providing at least three different operational voltages on said selected block decoder line.

38. The method of claim 25, wherein said flash memory decoder further comprises a sense amplifier coupled to said flash transistor array and configured to sense current in selected cells, further comprising the steps of:

applying a plurality of voltages on a selected wordline at different times;

detecting a voltage threshold of selected cells coupled to said selected wordline in said sense amplifier; and applying an operational voltage on said selected wordline to perform said predetermined procedure, said operation voltage selected based at least in part on said voltage threshold.

* * * * *

UNITED STATES PATENT AND TRADEMARK OFFICE
CERTIFICATE OF CORRECTION

Page 1 of 1

PATENT NO.        : 5,848,000
APPLICATION NO.   : 08/819323
DATED             : December 8, 1998
INVENTOR(S)       : Peter W. Lee et al.

It is certified that error appears in the above-identified patent and that said Letters Patent is hereby corrected as shown below:

Title Page

(63) Delete "Continuation-in-part of Ser. No. 624,322, Mar. 29, 1996, Pat. No. 5,646,890, Ser. No. 645,630, May 14, 1996, Pat. No. 5,687,121, Ser. No. 676,066, Jul. 5, 1996, Ser. No. 726,670, Oct. 7, 1996, Pat. No. 5,682,350, and Ser. No. 779,765, Jan. 7, 1997, abandoned." and substitute
-- Continuation-in-part of Ser. No. 624,322, Mar. 29, 1996, Pat. No. 5,646,890, Ser. No. 645,630, May 14, 1996, Pat. No. 5,687,121, Ser. No. 676,066, Jul. 5, 1996, Ser. No. 726,670, Oct. 7, 1996, Pat. No. 5,682,350, Ser. No. 60/034,602, Jan. 3, 1997, and Ser. No. 779,765, Jan. 7, 1997, abandoned. --

Signed and Sealed this
Eleventh Day of October, 2011

David J. Kappos
*Director of the United States Patent and Trademark Office*